United States Patent [19]

Gillery et al.

[11] Patent Number: 4,478,702

[45] Date of Patent: Oct. 23, 1984

[54] ANODE FOR MAGNETIC SPUTTERING APPARATUS

[75] Inventors: F. Howard Gillery, Allison Park; Russell C. Criss, Pittsburgh, both of Pa.

[73] Assignee: PPG Industries, Inc., Pittsburgh, Pa.

[21] Appl. No.: 571,406

[22] Filed: Jan. 17, 1984

[51] Int. Cl.³ .............................................. C23C 15/00
[52] U.S. Cl. ................................ 204/298; 204/192 R; 204/192 C
[58] Field of Search ........................... 204/298, 192 R

[56] References Cited

U.S. PATENT DOCUMENTS

| 4,162,954 | 7/1979 | Morrison | 204/298 |
| 4,166,018 | 8/1979 | Chapin | 204/298 |
| 4,239,611 | 12/1980 | Morrison | 204/298 |
| 4,422,896 | 12/1983 | Class et al. | 204/298 |

OTHER PUBLICATIONS

Denton, Metal Finishing, Jun. 1979. pp. 53–57.

Primary Examiner—Arthur P. Demers
Attorney, Agent, or Firm—Donna L. Seidel

[57] ABSTRACT

An improved anode system for producing uniform coatings by magnetic sputtering is disclosed, comprising a pair of anode plates symmetrically designed and positioned along the length of the cathode.

6 Claims, 2 Drawing Figures

ANODE FOR MAGNETIC SPUTTERING APPARATUS

Background of the Invention

This invention relates generally to the art of magnetic sputtering, and more particularly to the art of anode designs for magnetic sputtering.

U.S. Pat. No. 4,166,018 to Chapin describes a sputtering apparatus in which a magnetic field is formed adjacent a planar sputtering surface, the field comprising arching lines of flux over a closed loop erosion region on the sputtering surface. Chapin teaches that the configuration of the anode is relatively unimportant, but it is preferred that the anode be of relatively small size compared to the cathode surface. In the illustrated embodiment, the anode comprises a bar of relatively small cross-section which extends around the cathode spaced from its perimeter.

In prior art literature on magnetic sputtering, the design of the anode system is typically either ignored or dismissed as relatively unimportant. However, it has been discovered, in accordance with the present invention, that appropriate anode design is essential to attaining very uniform sputtered films, particularly in reactive sputtering processes, and most especially when depositing insulating layers, such as titanium oxide.

Summary of the Invention

The present invention involves an anode system designed to optimize uniformity of a sputtered film across and along a substrate surface. The anode system of the present invention is particularly well designed for use with an elongated rectangular cathode of the type typically used in a scanning magnetron sputtering coating apparatus. The anode system of the present invention generally comprises two separate anode plates disposed on opposite sides of the cathode. The dimensions and placement of the anodes are very important. Each anode should be at least substantially the same length as the parallel dimension of the substrate to be coated, typically about the same length as the cathode. The width of the anode is less important, but is preferably substantially less than the length, since the effectiveness of the anode diminishes with distance from the cathode. The thickness of the anode is preferably minimal. An elongated rectangular strip of metal provides a particularly suitable anode plate. When the surfaces are essentially coplanar, the anodes are spaced slightly from the edges of the opposite sides of the cathode, the crucial factor being that the spacing is uniform along the length of the cathode. When the surfaces are parallel but not coplanar, the anodes may be moved laterally inward, even overlapping the cathode, so long as they remain outside the main body of the glow discharge. When the surfaces are not parallel, the anodes may be inclined in order to maintain the effective surfaces as close as possible to the main body of the glow discharge without entering that area, so long as the spacing from the cathode is uniformly maintained along its length. In anode configurations in accordance with the present invention, the anode does not extend along the minor dimension of the magnetic tunnel.

In a further refinement of anode design in accordance with the present invention, anode systems may be shaped to provide coatings with uniform gradients of thickness deposited with either stationary or scanning cathodes. This feature of the present invention is of particular interest in the sputtering of electroconductive materials, which, as a result, can be deposited as films with gradient conductivity.

Detailed Description of the Preferred Embodiments

Figure 1:
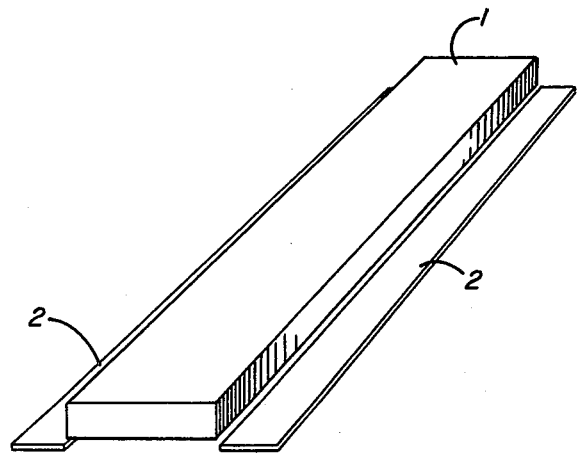
FIG. 1 illustrates an elongated rectangular cathode 1 with a pair of elongated rectangular anodes 2 spaced laterally from the cathode and with their bottom surfaces essentially coplanar.

In a typical commercially available magnetic sputtering coating apparatus, the anode supplied consists of an elongated loop of copper tubing disposed on one side of an elongated rectangular cathode. In operation, this system deposits a coating of extremely poor uniformity. For example, when sputtering a titanium oxide film from a titanium metal cathode 40 inches (1 meter) long and 6 inches (15 centimeters) wide scanning over a distance of 24 inches (61 centimeters) at a distance of 3 inches (7.6 centimeters) from the substrate in an atmosphere of 13 percent oxygen in argon at an average current density of 0.0625 amps per square inch (0.0097 amps per square centimeter), the thickness of the coating varies by 30 percent. Typically, a thick band of coating is formed along one edge of the substrate and bands of varying thickness are formed in the center.

In the development of the present invention, it was deduced from a series of experiments that as electrons leave the face of the cathode and travel in the magnetic tunnel created by the magnetic field developed by the sputtering apparatus, they begin to lose energy and are attracted to the anode. As a result, it was discovered, the shape of the anode and its proximity to the magnetic tunnel tend to affect the current flow along the cathode, thereby determine the rate of deposition of the coating, and ultimately control the film thickness.

The superior anode designs of the present invention provide uniform current flow along the cathode, which promotes a uniform deposition rate, which results in a uniform film. The superior anode designs for depositing uniform films in accordance with the present invention comprise a pair of anodes disposed on opposite sides of a cathode, wherein the major dimension (length) of the anodes is substantially equal to the major dimension (length) of the cathode, and the spacing between the cathode and each anode is uniform along its length. The effective surfaces of the anodes are preferably parallel with the sputtering surface of the cathode, or tangentially spaced from the major dimension of the glow discharge area.

In one preferred embodiment of the present invention, a pair of elongated rectangular anodes 2 is disposed on opposite sides of an elongated rectangular cathode 1 as in FIG. 1. The effective surfaces of the anodes are the bottom surfaces which are parallel, in fact essentially coplanar, with the sputtering surface of the cathode. The anode plates are typically strips of copper metal, preferably water-cooled. When the cathode sputtering surface measures 40 by 6 inches (102 by 15 centimeters) the anodes preferably measure approximately 40 by 2 by 1/16 inches (102 by 5 by 0.16 centimeters). The length of the anodes is the critical dimension, being at least equal to the parallel dimension of the substrate to be coated, typically about the same length as the cathode. The width is less important, since the effectiveness of the anode surface decreases with distance from the cathode. The thickness of the anodes is even less important, and may be minimal. Elongated strips of metal, preferably copper, provide particularly suitable anodes.

Figure 2:
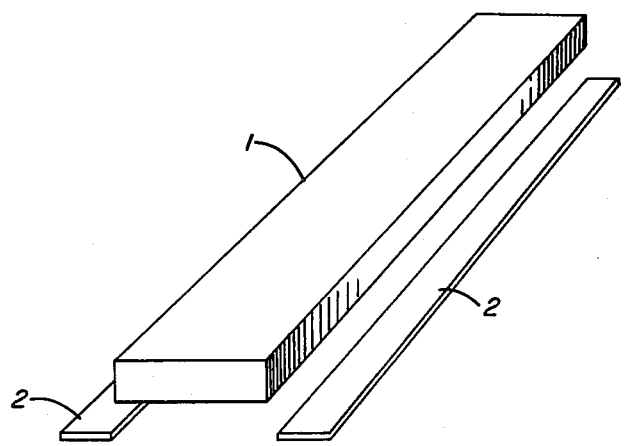
FIG. 2 illustrates an elongated rectangular cathode 1 with a pair of elongated rectangular anodes 2 spaced vertically from the cathode so that their major surfaces are parallel but not coplanar.

When the anode design described above is used in the deposition of titanium oxide from a titanium metal cathode, the effective surfaces of the anodes tend to lose efficiency as they become coated with an insulating layer of titanium oxide which is scattered back from the substrate surface onto the anode surfaces. For this reason, a more preferred embodiment of the present invention is the anode design illustrated in FIG. 2, wherein a pair of elongated rectangular anodes 2 is disposed on opposite sides of an elongated rectangular cathode 1. The anodes may be spaced laterally from the cathode as in FIG. 1, but are preferably also vertically displaced, typically by about 1.5 inches (about 3.8 centimeters). In this embodiment, the upper surfaces of the anodes are the effective surfaces. Although sputtered material will eventually be deposited on the top surface of the anodes as well as the bottom surfaces, the effective upper surfaces will be coated with titanium oxide in a more reduced, and thus more conductive, state, and will therefore not decrease in efficiency as quickly.

In accordance with the present invention, a symmetrical anode design is required in order to form a coating of uniform thickness. Symmetry with respect to both the major and minor axes of the sputtering surface is required. A pair of anode plates is designed to extend along the major dimension of the magnetic tunnel, but not across its minor dimension. Correlatively, an asymmetrical anode system may be designed to produce a coating of a desired thickness gradient.

Although the present invention has been discussed in detail above with respect to a titanium cathode, copper anodes and a scanning apparatus, various other target materials, such as indium, may be used, as well as other anode metals and configurations. Either scanning or stationary cathodes may be used to produce either uniform or gradient coatings. The present invention will be further understood from the description of the specific example which follows.

Example

A titanium cathode with a sputtering surface measuring 40 inches (102 centimeters) by 6 inches (15 centimeters) is scanned over a distance of 24 inches (61 centimeters) at a spacing of 3 inches (7.6 centimeters) from a glass substrate. The cathode is sputtered at an average current density of 0.0625 amps per square inch (0.0097 amps per square centimeter) in an atmosphere of 13 percent oxygen in argon to produce a titanium oxide coating. The thickness of the coating varies by less than 10 percent, and is visually uniform, compared with a visually nonuniform coating which varies in thickness by 30 percent when using the loop anode on one side of the cathode commercially supplied.

The above example is offered only to illustrate the present invention, the scope of which is defined by the following claims.

We claim:

1. In an apparatus for coating a substrate comprising a cathode having a substantially planar surface consisting of a material to be sputtered, magnet means for producing a magnetic field having lines of flux which extend in a curve from said sputtering surface and return thereto to form a magnetic tunnel over a closed loop erosion region on said sputtering surface, an anode positioned to produce an accelerating electric field adjacent said sputtering surface for producing a glow discharge confined by said magnetic field to the region adjacent said sputtering surface and within said magnetic tunnel, and means for connecting said cathode and said anode to a source of electrical potential, the improvement which comprises said anode being symmetrically designed and positioned, and evenly spaced from the major dimension of said magnetic tunnel outside the zone of glow discharge confinement, and said anode extending only along the major dimension of the magnetic tunnel in order to provide a uniform sputtered coating.

2. The improved apparatus according to claim 1, wherein the cathode is of elongated rectangular shape, and the anode comprises a pair of anode plates positioned on opposite sides of the cathode evenly spaced along its length.

3. The improved apparatus according to claim 2, wherein each anode plate is of elongated rectangular shape substantially the same length as the cathode, positioned with its effective surface parallel with the sputtering surface of the cathode.

4. The improved apparatus according to claim 3, wherein the effective surfaces of the anode plates are substantially coplanar with the sputtering surface of the cathode.

5. The improved method according to claim 4, wherein the effective surfaces of the anode plates are positioned tangentially spaced from the glow discharge.

6. In an apparatus for coating a substrate comprising a cathode having a substantially planar surface consisting of a material to be sputtered, magnet means for producing a magnetic field having lines of flux which extend in a curve from said sputtering surface and return thereto to form a magnetic tunnel over a closed loop erosion region on said sputtering surface, an anode positioned to produce an accelerating electric field adjacent said sputtering surface for producing a glow discharge confined by said magnetic field to the region adjacent said sputtering surface and within said magnetic tunnel, and means for connecting said cathode and said anode to a source of electric potential, the improvement which comprises said anode being asymmetrically designed to produce a gradient sputtered coating.

* * * * *

UNITED STATES PATENT AND TRADEMARK OFFICE
CERTIFICATE OF CORRECTION

PATENT NO. : 4,478,702
DATED : October 23, 1984
INVENTOR(S) : F. Howard Gillery et al It is certified that error appears in the above-identified patent and that said Letters Patent are hereby corrected as shown below:

In column 4, line 41, Claim 5, "method" was changed in an amendment under Rule 312 and should read --apparatus--.

Signed and Sealed this

Tenth Day of September 1985

[SEAL]

Attest:

DONALD J. QUIGG

Attesting Officer   Acting Commissioner of Patents and Trademarks - Designate